United States Patent [19]
Ashida

[11] Patent Number: 6,153,877
[45] Date of Patent: Nov. 28, 2000

[54] PROJECTION EXPOSURE APPARATUS

[75] Inventor: Itsuji Ashida, Tokyo, Japan

[73] Assignee: Oki Electric Industry Co. Ltd., Tokyo, Japan

[21] Appl. No.: 09/112,015

[22] Filed: Jul. 8, 1998

[30] Foreign Application Priority Data

Jul. 11, 1997 [JP] Japan ..................................... 9-185614

[51] Int. Cl.⁷ ........................... H01L 21/30; G03B 27/42

[52] U.S. Cl. ............................. 250/216; 250/548; 355/30

[58] Field of Search ..................................... 250/215, 216, 250/238, 559.3, 548; 356/401; 355/30, 53; 359/364, 365, 366

[56] References Cited

U.S. PATENT DOCUMENTS

| | | | |
|---|---|---|---|
| 5,877,843 | 3/1999 | Takagi et al. | 355/30 |
| 5,975,816 | 11/1999 | Endo | 62/179 |
| 5,995,263 | 11/1999 | Tokuda et al. | 359/196 |

*Primary Examiner*—John R. Lee
*Attorney, Agent, or Firm*—Rabin & Champagne, PC

[57] ABSTRACT

An object of a inventions of the present application is raising the pattern position precision by stabilizing the temperature of a reticle or a reduction lens in a projection aligner. The projection aligner comprises a reticle stage with a reticle, a light source emitting light to the reticle, a reduction lens projecting the light onto the wafer via the reticle, and a temperature control unit controlling the temperature of the reticle or/and a reduction lens by a clean air.

24 Claims, 15 Drawing Sheets

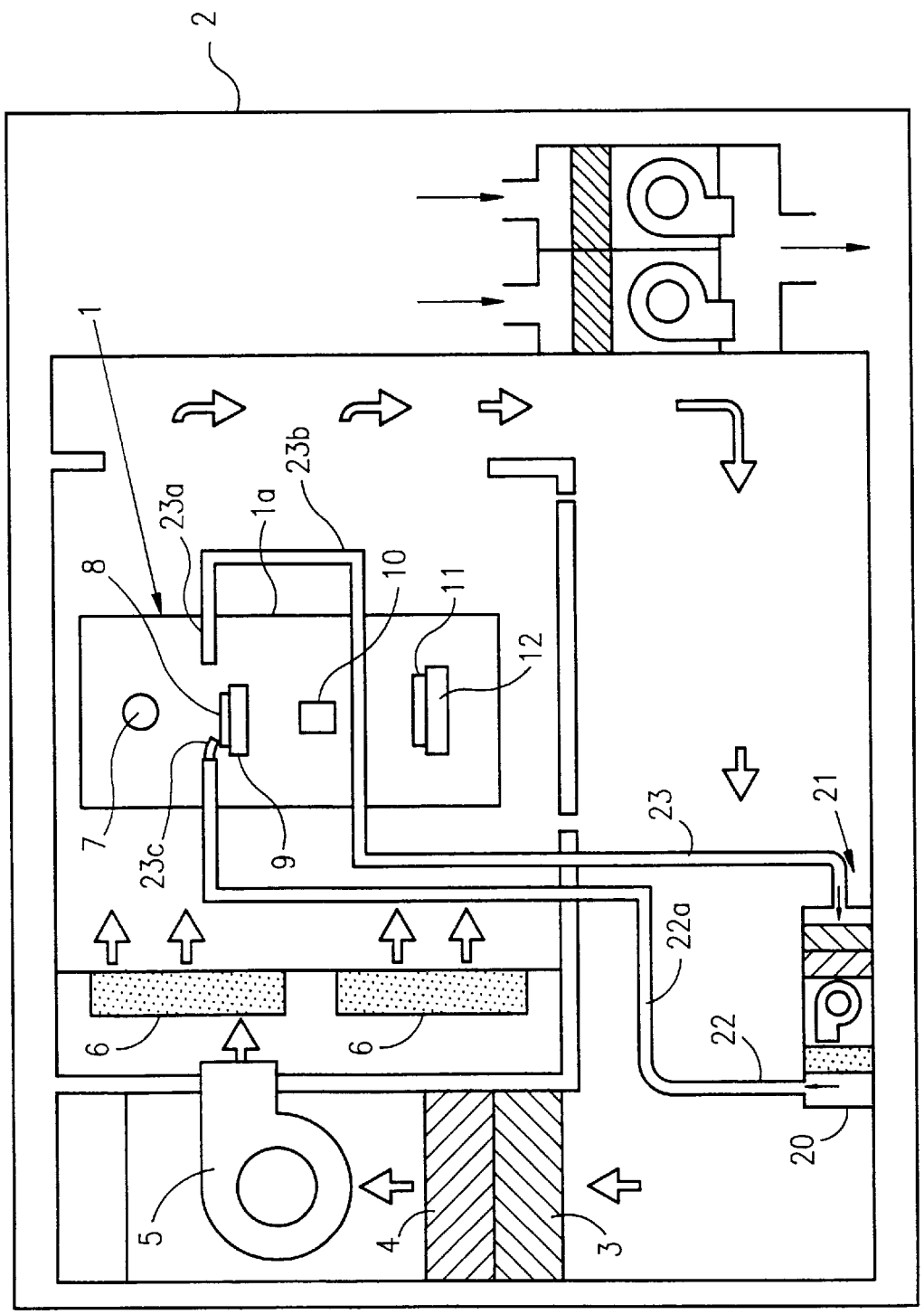

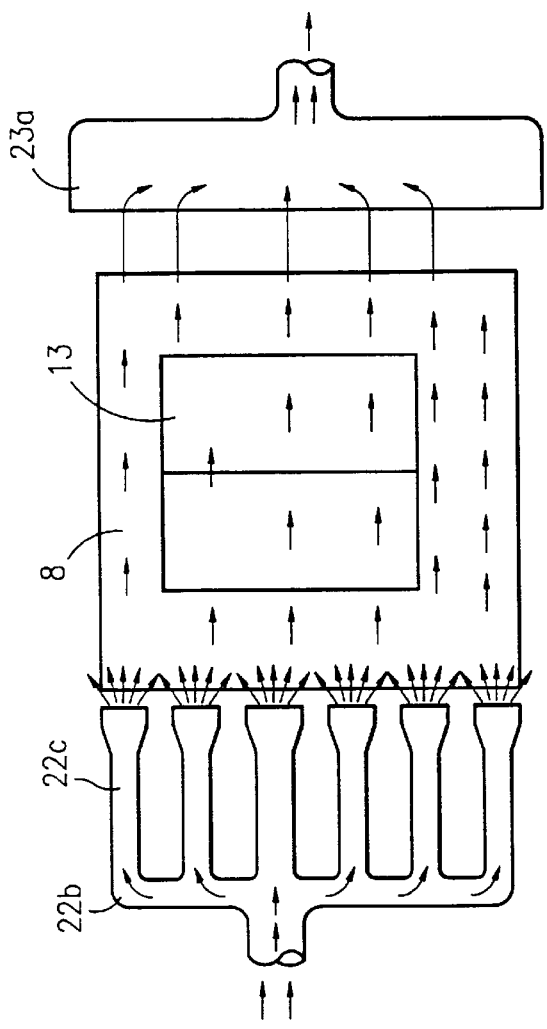
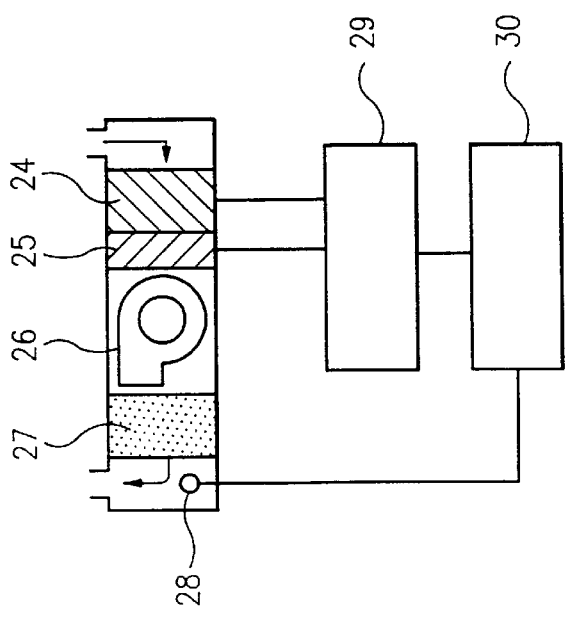
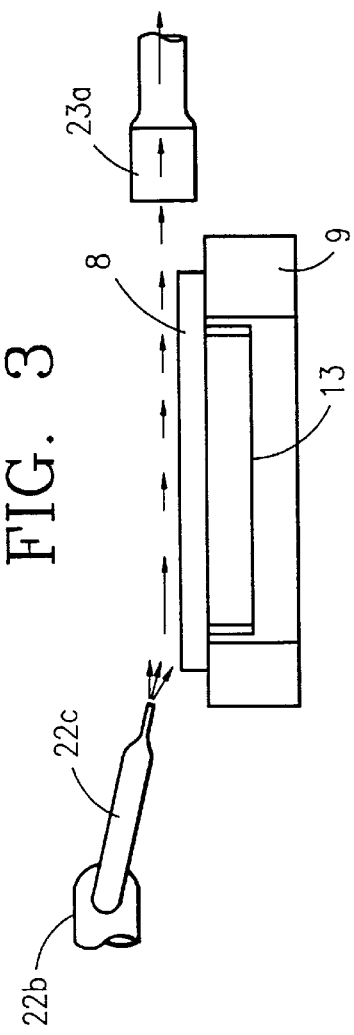

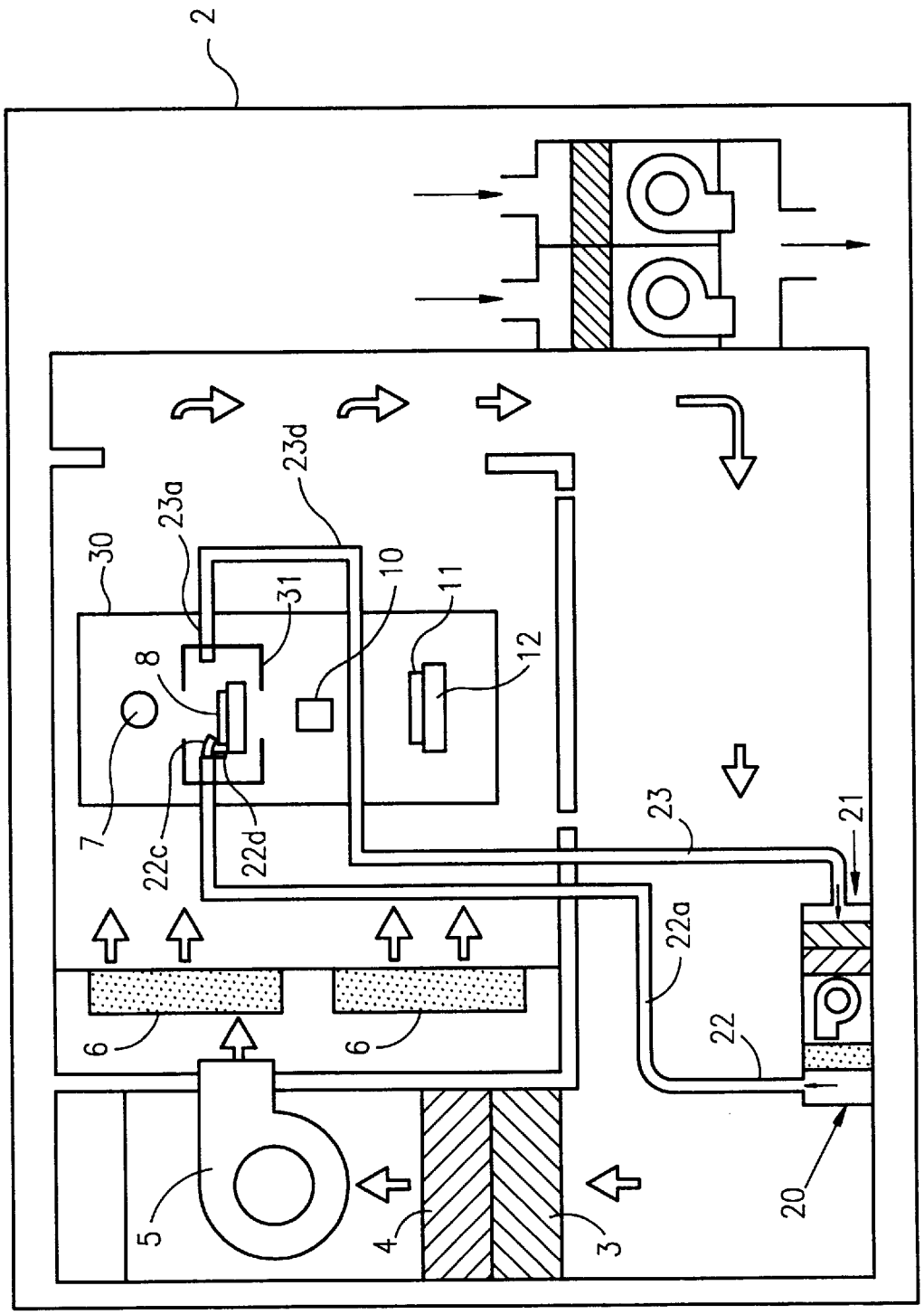

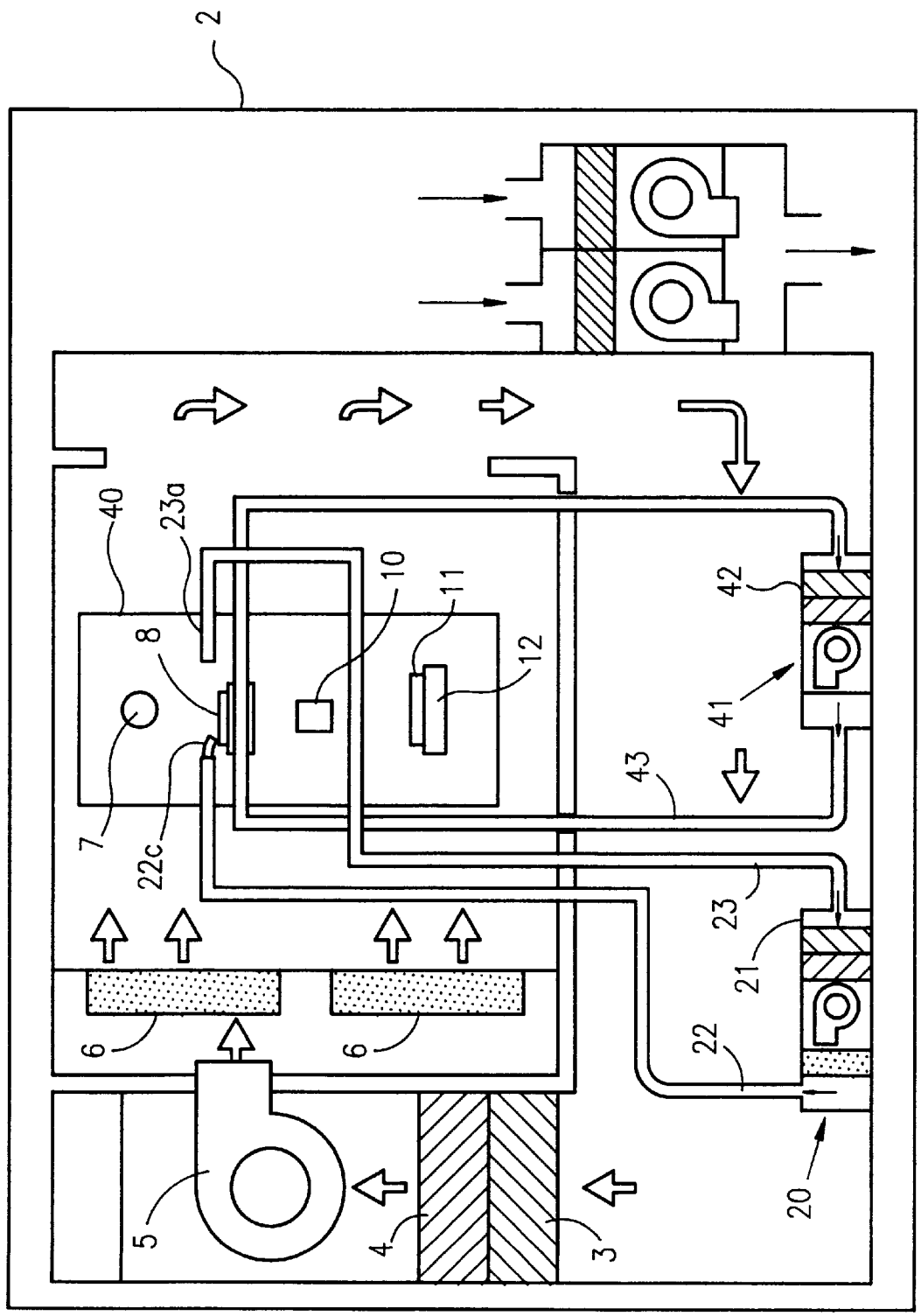

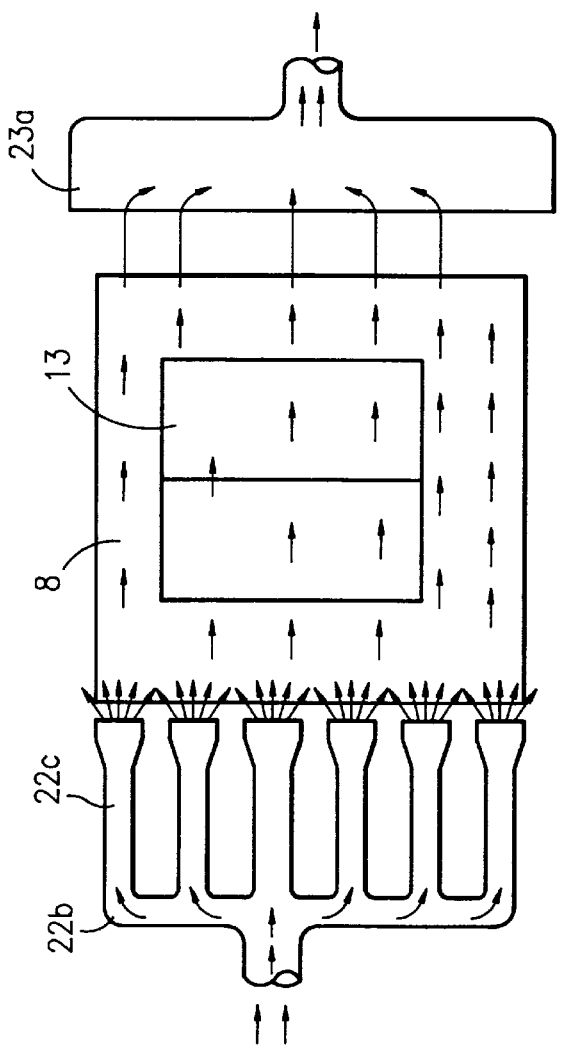
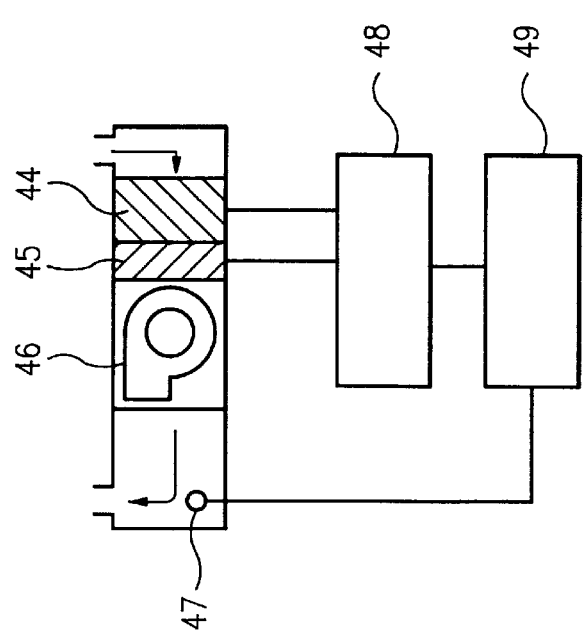
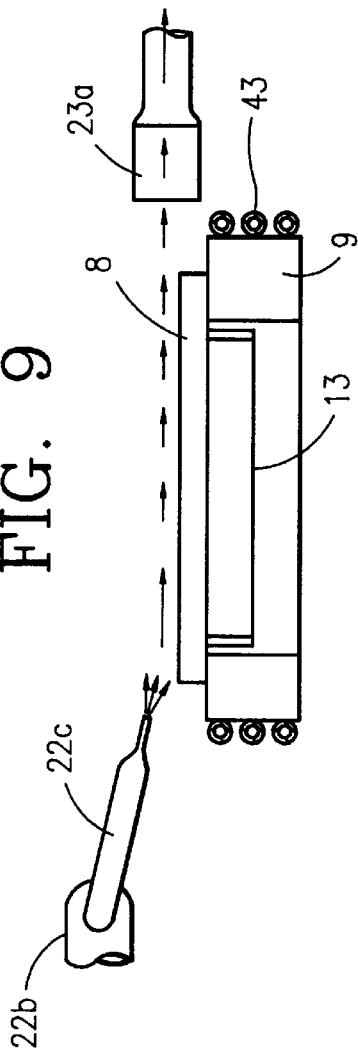

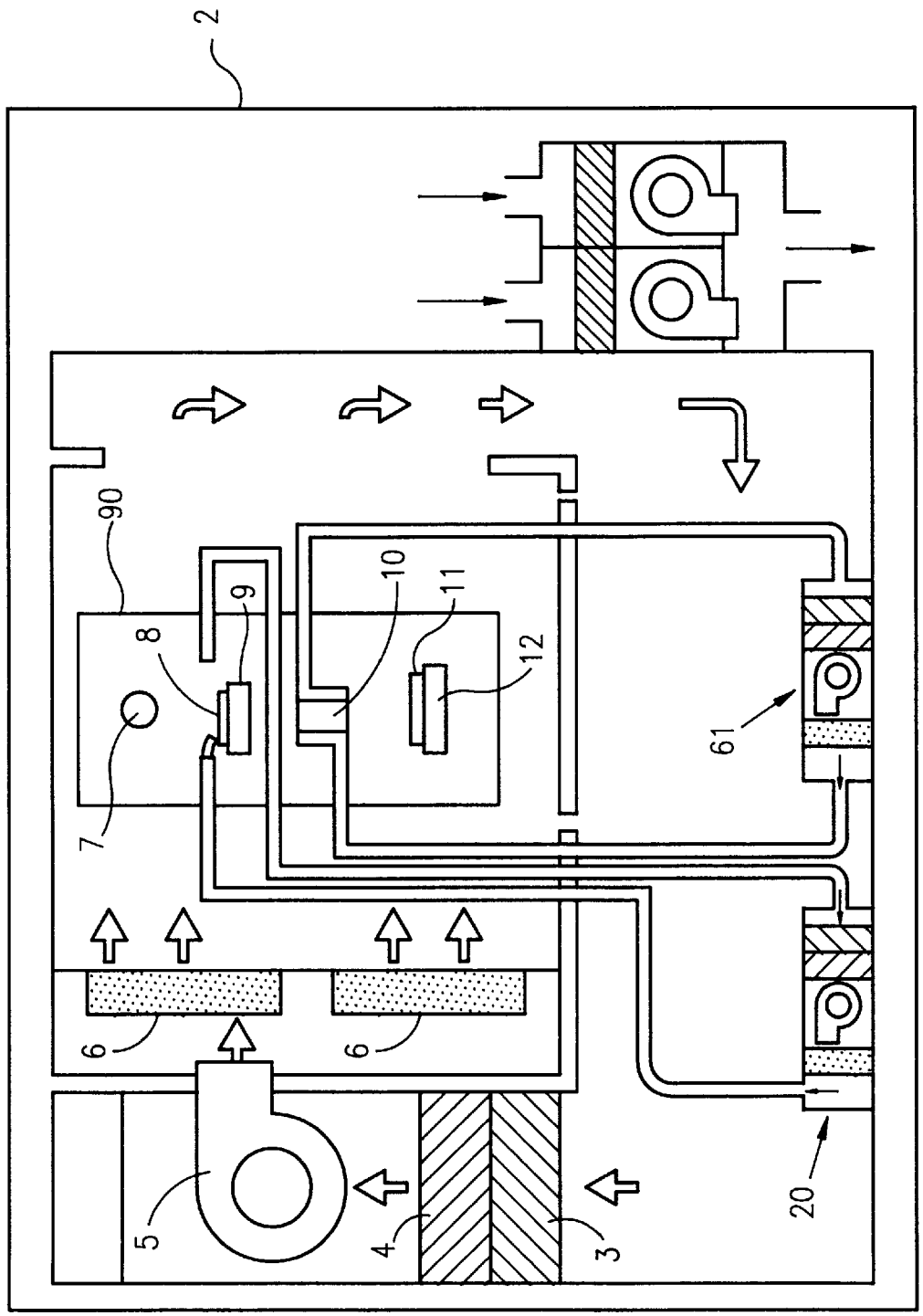

PROJECTION EXPOSURE APPARATUS

BACKGROUND OF THE INVENTION

1. Field of the Invention

This invention relates to a projection aligner (projection exposure apparatus) for performing and exposing so that a pattern drawn on a reticle is projected onto a wafer by light emitted from the light source.

2. Description of the Related Art

A projection aligner is used for manufacturing semiconductor devices. The projection aligner has a light source, a reticle stage with a reticle, a wafer stage with a wafer and a reduction lens(scale-down projection lens). During a projection exposure operation, a pattern on the reticle is projected onto the wafer via the reduction lens by light emitted from the light source.

Recently, the projection aligner is required to have a high-pattern position precision for coping with the latest devices. For increasing the pattern position precision, rising temperatures in the projection aligner by the light emitted from the light source, is not to be disregarded. Pattern position precision is affected by the heat expansion of the reticle or by the changing the distribution of distortion of the reduction lens.

SUMMARY OF THE INVENTION

An object of the present application is to improve the pattern position precision by stabilizing the temperature of the reticle or the reduction lens in the projection aligner.

To achieve the object of the invention, the invention provides a projection aligner comprising a reticle stage with a reticle placed thereon, a light source emitting a light for irradiating the reticle, a reduction lens arranged so that a pattern drawn on the reticle is projected onto a wafer by light emitted from the light source, and a temperature control unit controlling the temperature of the reticle or the reduction lens.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 is a configurational view schematically showing a projection aligner according to a first embodiment of the present invention.

FIG. 2 ablock diagram showing the temperature control unit in FIG. 1.

FIG. 3 is a schematic side view showing, in an enlarged form neighborhood of the reticle shown in FIG. 1.

FIG. 4 is a schematic plane view of FIG. 3.

FIG. 5 is a configurational view schematically showing a projection aligner according to a second embodiment of the present invention.

FIG. 8 is a configurational view schematically showing a projection aligner according to a third embodiment of the present invention.

FIG. 9 is a schematic side view showing, in an enlarged form, the neighborhood of the reticle shown in FIG. 8.

FIG. 10 is a schematic plane view of FIG. 9.

FIG. 11 a block diagram showing the temperature control unit in FIG. 8.

FIG. 24 is a configurational view schematically showing a projection aligner according to a eighth embodiment of the present invention.

DETAILED DESCRIPTION OF THE PREFERRED EMBODIMENTS

Figure 6:
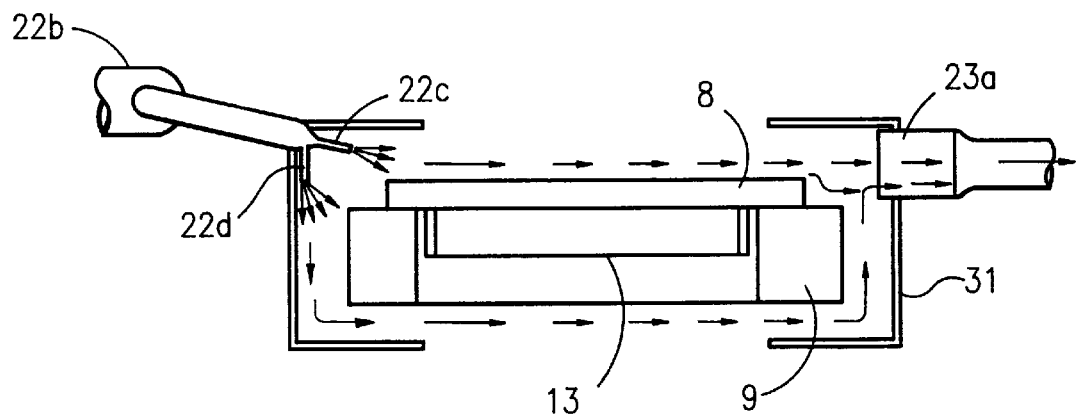
FIG. 6 is a schematic side view showing, in an enlarged form, the neighborhood of the reticle shown in FIG. 5.

Preferred embodiments of the present invention will hereinafter be described in detail with reference to the accompanying drawings.

FIG. 1 is a configurational view schematically showing a projection aligner according to a first embodiment of the present invention.

In the first embodiment as shown in FIG. 1, an air-conditioning unit having a cooler 3, a heater 4, a air blower 5 and a ULPA (Ultra Low Penetration Air-filter) controls temperatures inside an environmental chamber 2 (environments around the projection aligner 1) and clears dust from the inside of the environmental chamber 2. Open arrows shown in FIG. 1 indicate flows of clean air within the environmental chamber 2.

As shown in FIG. 1, the projection aligner 1 according to the first embodiment has, for example, a light source 7 such as an ArF excimer laser or the like, a reticle stage 9 with a reticle (e.g., 4×(four-times) reticle) 8 placed thereon, a reduction lens 10, and a wafer stage and XY stage unit 12 with a wafer 11 placed thereon. Exposure is performed so that a pattern drawn on the reticle 8 is projected onto the wafer 11 by light emitted from the light source 7.

Further, the projection aligner 1 according to the first embodiment has a first temperature control unit (temperature control unit) 20 for directly applying clean air temperature-controlled to within a temperature, range of ±0.1°C. of a set temperature to the reticle 8 to thereby regulate or control the temperature of the reticle 8. The first temperature control unit 20 has a part 21 for supplying clean air subjected to temperature control and dust removal, an air-blowing part 22 for feeding the clean air to the inside of a casing or enclosure 1a of the projection aligner 1, and a discharge part 23 discharging the clean air passed through the periphery of the reticle 8 from the enclosure 1a of the projection aligner 1 and returning it to the supply part 21.

FIG. 2 is a block diagram showing the supply part 21. As shown in FIG. 2, the supply part 21 has a cooler 24, a heater 25, an air blower 26 and a ULPA filter 27. Further, the supply part 21 has a temperature sensor 28, a circuit 29 for driving the cooler 24 and the heater 25, and a circuit 30 for controlling both operations of the cooler 24 and the heater 25 based on a value detected by the temperature sensor 28. The control circuit 30 controls both operations of the cooler 24 and the heater 25 so that the temperature of the clean air discharged from the supply part 21 falls within ±0.1° C. of the set temperature. The reason why the temperature of the clean air is set within ±0.1° C. of the set temperature, is that since the position of a pattern on a 6-inch reticle is shifted by about 0.0281 $\mu$m when the reticle (whose effective area is 125 mm$^2$) is raised by 0.3° C. in temperature and this value makes up about 50% of a value (e.g., 0.05 $\mu$m or 0.06 $\mu$m) adopted as a reticle exposure device accuracy (overlay allowable accuracy) required for fabrication of ULSI, the remaining allowable error becomes extremely small. This is also because the temperature of the clean air is in an error range of temperatures set to the present practically-utilized temperature control unit. Incidentally, the set position of the temperature sensor 28 is not limited to the position illustrated in the drawing. This sensor 28 may also be located in the neighborhood of the reticle 8, for example.

FIG. 3 is a schematic side view showing, in an enlarged form, the neighborhood of the reticle shown in FIG. 1. FIG. 4 is a schematic plane view of FIG. 3. The arrows in FIGS. 3 and 4 indicate flows of clean air. As shown in FIG. 1, 3 or 4, the air blowing part 22 has a piping 22a for feeding clean air delivered from the supply part 21 to the inside of the enclosure of the projection aligner 1, a manifold 22b coupled to the piping 22a, and a plurality of blow-off nozzles (blowing parts) 22c, which are formed at the leading end of the manifold 22b and discharge clean air to the surface (upper surface) on the light source 7 side, of the reticle 8. Reference numeral 13 indicates a pellicle attached to the reticle 8.

The discharge (intake) part 23 has a discharge port 23 a provided on the opposite side of the blow-off nozzles 22c with the reticle 8 interposed therebetween, and a piping 23 b for feeding back clean air to the supply part 21.

Upon projection exposure, as shown in FIGS. 3 and 4, the clean air controlled to within ±0.1° C. of the set temperature by the first temperature control unit 20 is directly applied over the entire upper surface (i.e., the side opposite to the pellicle surface and pattern surface) of the reticle 8 through the blow-off nozzles 22c so as to flow toward the discharge port 23 a along the upper surface of the reticle 8.

According to the projection aligner 1 of the first embodiment, as has been described above, the outer side of the enclosure 1a of the projection aligner 1 is temperature-controlled. Further, the clean air temperature-controlled to within ±0.1° C. of the set temperature by the first temperature control unit 20 is directly applied to the reticle 8 inside the enclosure 1a of the projection aligner 1. As a result, the temperature of the reticle 8 can be stabilized. Therefore, even when the 4× reticle is used or the reticle is increased in size, an error of a overlay accuracy within the reticle 8 is prevented and hence a ULSI subjected to patterning with a high-precision alignment accuracy is obtained. As a result, the yield of fabrication of the ULSI can be greatly improved. Since no pellicle exists on the upper surface of the reticle 8, a large cooling effect is obtained in the case of the present embodiment wherein the clean air has been applied onto the upper surface of the reticle 8.

Figure 7:
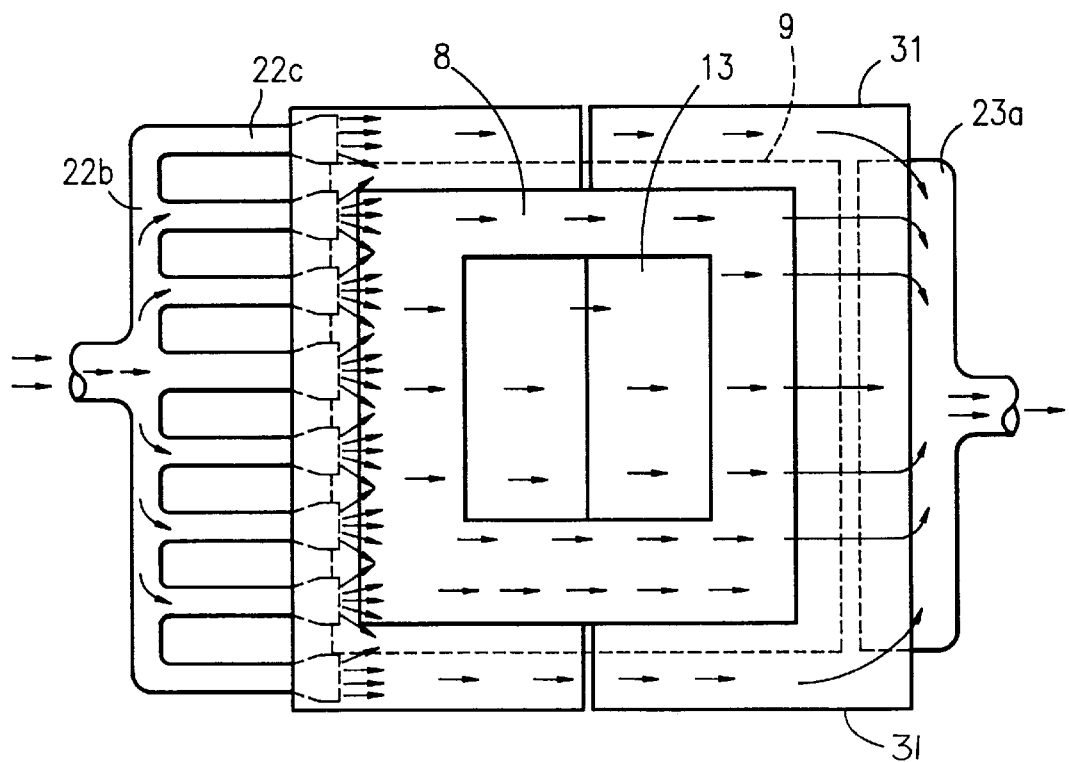
FIG. 7 is schematic plane view of FIG. 6.

FIG. 5 is a configurational view schematically showing a projection aligner according to a second embodiment of the present invention. FIG. 6 is a schematic side view illustrating, in an enlarged form, the neighborhood of the reticle shown in FIG. 5. FIG. 7 is a schematic plane view of FIG. 6.

In FIGS. 5 through 7, the same elements of structure as those shown in FIGS. 1 through 4 or the elements of structure corresponding to those shown in FIGS. 1 through 4 are identified by the same reference numerals. The projection aligner 30 according to the second embodiment is different from the projection aligner 1 according to the first embodiment only in that a cover (box) 31 for covering the outer sides of a reticle 8 and a reticle stage 9 is provided and blow-off nozzles 22d for allowing clean air to flow toward the side and lower surface of the reticle stage 9 are provided in addition to the blow-off nozzles 22c.

Upon projection exposure, as shown in FIGS. 6 and 7, clean air temperature-controlled to within ±0.1° C. of a set temperature by a first temperature control unit 20 is fed into the cover 31 through the blow-off nozzles 22c and the blow-off nozzles 22d and thereafter blown to a discharge port 23 a along the upper surface of the reticle 8 and the side and lower surface of the reticle stage 9.

According to the projection aligner 30 of the second embodiment, as has been described above, the cover 31 is provided and the blow-off nozzles 22d extending directly below the reticle 8 are also provided in addition to the blow-off nozzles 22c directed to the upper surface of the reticle 8. As a result, the temperature of the reticle stage 9 as well as both surfaces of the reticle 8 can be stabilized. Therefore, even when a 4× reticle is used or the reticle is increased in size, an error of a pattern position precision within the reticle 8 is prevented and hence a ULSI subjected to patterning with a high-precision alignment accuracy is obtained. As a result, the yield of production of the ULSI can be greatly improved.

FIG. 8 is a configurational view schematically showing a projection aligner according to a third embodiment of the present invention. FIG. 9 is a schematic side view illustrating, in an enlarged form, the neighborhood of a reticle. FIG. 10 is a schematic plane view of FIG. 9.

In FIGS. 8 through 10, the same elements of structure as those shown in FIGS. 1 through 4 or the elements of structure corresponding to those shown in FIGS. 1 through 4 are identified by the same reference numerals. The projection aligner 40 according to the third embodiment is different from the projection aligner 1 according to the first embodiment only in that a second temperature control unit 41 for controlling the temperature of a reticle 8 is provided. The second temperature control unit 41 has a cooling water supply part 42 and a piping 43 for allowing cooling water to flow.

FIG. 11 is a configurational view showing the supply part 42. As shown in FIG. 11, the supply part 42 has a cooler 44, a heater 45 and a pump 46. Further, the supply part 42 includes a temperature sensor 47, a circuit 48 for driving the cooler 44 and the heater 45, and a circuit 49 for controlling both operations of the cooler 44 and the heater 45 based on a value detected by the temperature sensor 47. The control circuit 49 controls both operations of the cooler 44 and the heater 45 so that cooling water discharged from the supply part 42 falls within ±0.1° C. of a set temperature. Incidentally, the set position of the temperature sensor 47 is not limited to the position illustrated in the drawing. This sensor may be located in the vicinity of a reticle stage 9, for example.

Upon projection exposure, as shown in FIGS. 9 and 10, clean air temperature-controlled to within ±0.1° C. of a set temperature by a first temperature control unit 20 is fed to the upper surface of the reticle 8 through blow-off nozzles 22c and discharged through a discharge port 23 a. Simultaneously with this, the cooling water temperature-controlled to within ±0.1° C. of the set temperature by the second temperature control unit 41 is caused to flow into the piping 43 to thereby cool the reticle stage 9.

According to the projection aligner 40 of the third embodiment, as has been described above, the upper surface of the reticle 8 is cooled by the clean air temperature-controlled to within ±0.1° C. of the set temperature. Further, the reticle stage 9 is cooled by the cooling water temperature-controlled to within ±0.1° C. of the set temperature. Therefore, the lower part (e.g., the four corners of the reticle, i.e., an area being in contact with the reticle stage 9) of the reticle 8 is also cooled by the reticle stage 9. Thus, even if the reticle 8 is irradiated with repetitive UV light or deep UV light (excimer laser beam) by the projection aligner 40, the reticle 8 is more effectively prevented from increasing in temperature. Therefore, since an error of a pattern position precision within the reticle 8 is prevented and a ULSI subjected to patterning with a high-precision alignment accuracy is obtained, the yield of fabrication of the ULSI can be greatly improved.

Since the piping 42 is wound on the side of the reticle stage 9, although the reticle 8 (with the pellicle) is automatically loaded onto and unloaded from the reticle stage 9, the piping 42 interferes with its loading and unloading.

Figure 12:
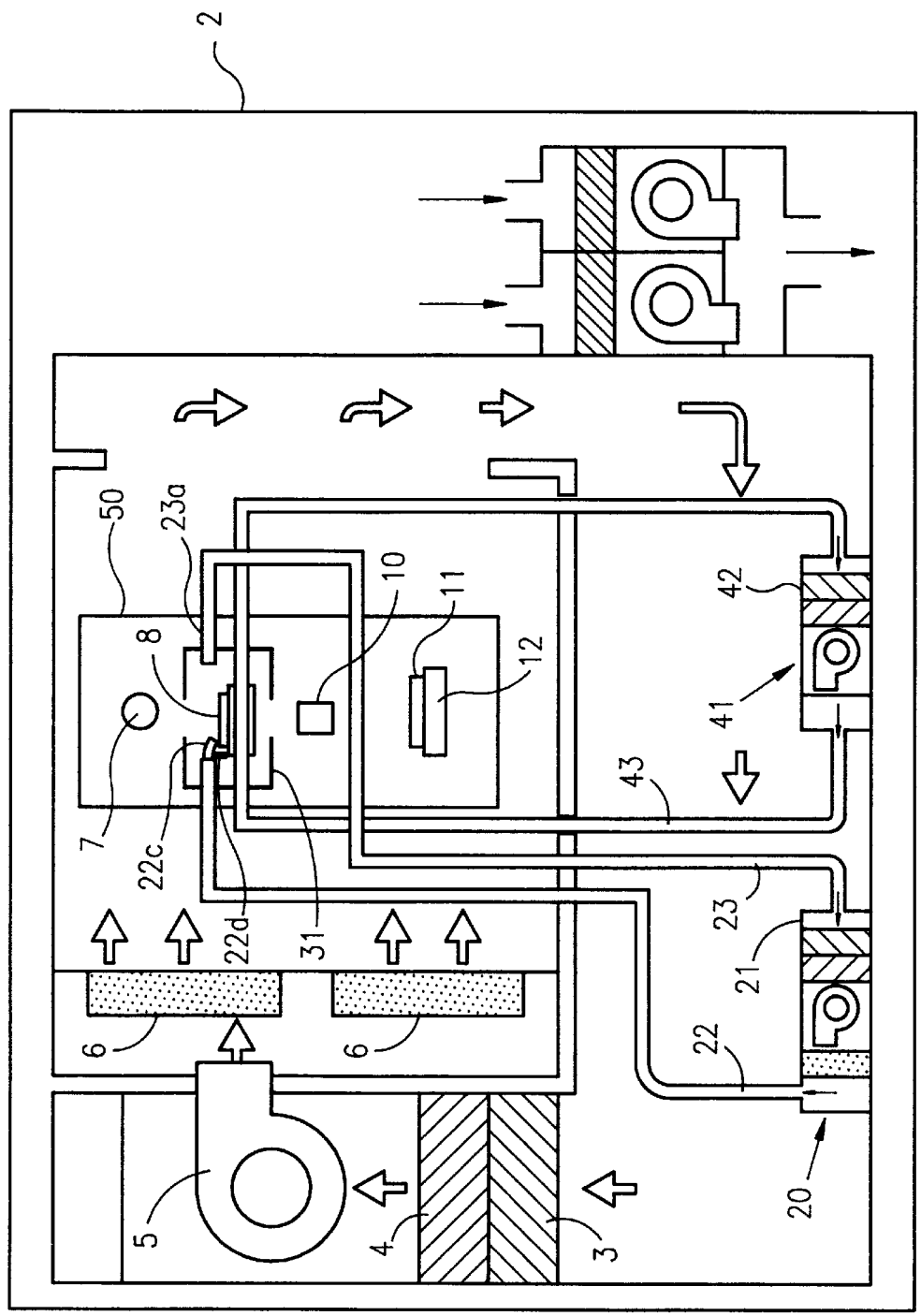
FIG. 12 is a configurational view schematically showing a projection aligner according to a fourth embodiment of the present invention.
Figure 13:
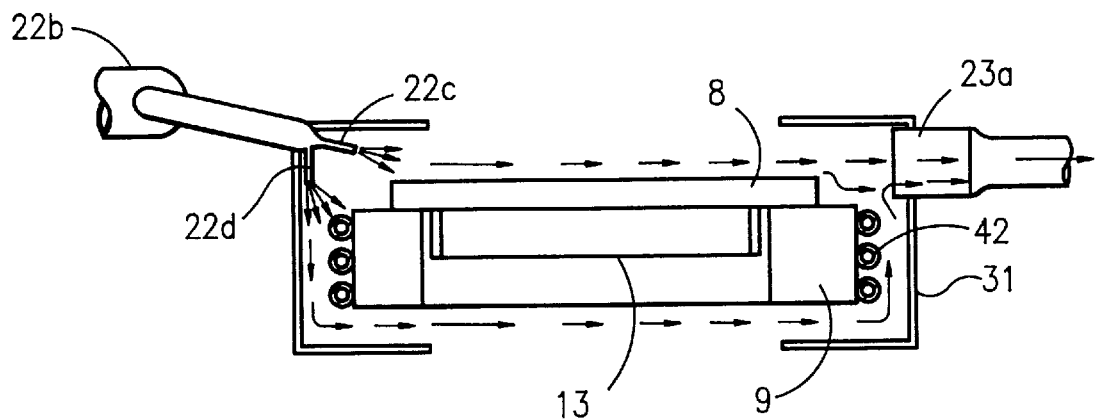
FIG. 13 is a schematic side view showing, in an enlarged form, the neighborhood of the reticle shown in FIG. 12.
Figure 14:
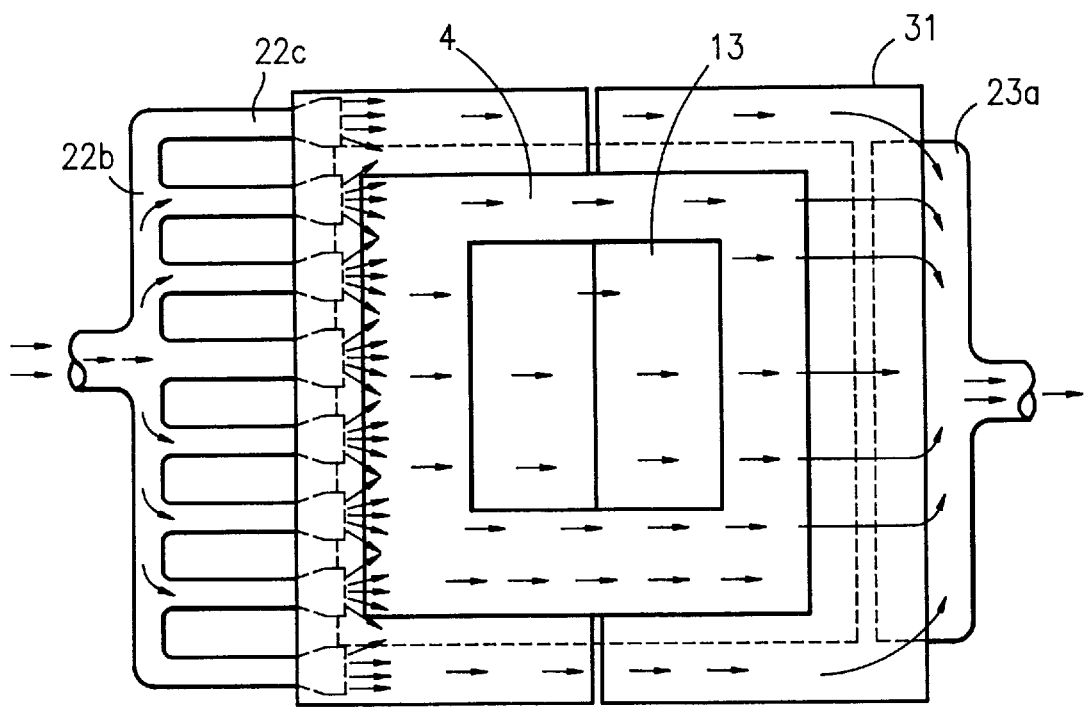
FIG. 14 is a schematic plane view of FIG. 13.

FIG. 12 is a configurational view schematically showing a projection aligner according to a fourth embodiment of the present invention. FIG. 13 is a schematic side view illustrating, in an enlarged form, the neighborhood of a reticle shown in FIG. 12. FIG. 14 is a schematic plane view of FIG. 13.

In FIGS. 12 through 14, the same elements of structure as those shown in FIGS. 8 through 11 or the elements of structure corresponding to those shown in FIGS. 8 through 11 are identified by the same reference numerals. The projection aligner 50 according to the fourth embodiment is different from the projection aligner 40 according to the third embodiment only in that a cover (box) 31 for covering the outer sides of a reticle 8 and a reticle stage 9 is provided and blow-off nozzles 22d for allowing clean air to flow toward the lower surface and side of the reticle stage 9 are provided in addition to the blow-off nozzles 22c.

Upon projection exposure, as shown in FIGS. 13 and 14, clean air temperature-controlled to within ±0.1° C. of a set temperature by a first temperature control unit 20 is fed into the cover 31 through the blow-off nozzles 22c and the blow-off nozzles 22d and thereafter blown to a discharge port 23 a along the upper surface of the reticle 8 and the lower surface of the reticle stage 9. Simultaneously with this, cooling water temperature-controlled to within ±0.1° C. of a set temperature by a second temperature control unit 41 is caused to flow into a piping 42 to thereby cool the reticle stage 9.

According to the projection aligner 50 of the fourth embodiment, as has been described above, the upper and lower surfaces of the reticle 8 are cooled by the clean air temperature-controlled to within ±0.1° C. of the set temperature. Further, the reticle stage 9 is cooled by the cooling water temperature-controlled to within ±0.1° C. of the set temperature. Therefore, even if the reticle 8 is irradiated with repetitive UV light or deep UV light, the reticle 8 is more effectively blocked from rising in temperature. Therefore, since an error of a pattern position precision within the reticle 8 is prevented from occurring and a ULSI subjected to patterning with a high-precision alignment accuracy is obtained, the yield of production of the ULSI can be greatly improved.

Figure 15:
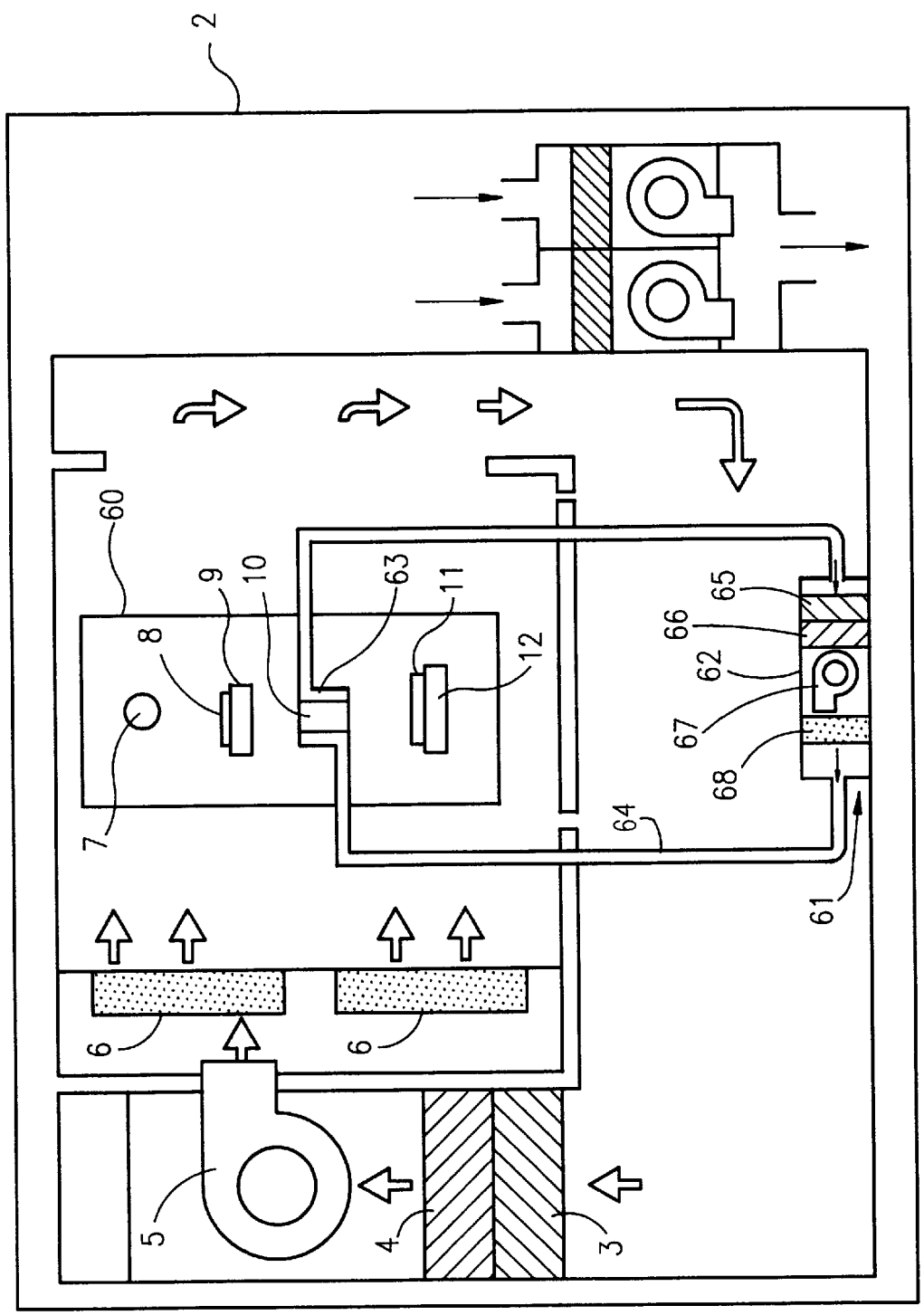
FIG. 15 is a configurational view schematically showing a projection aligner according to a fifth embodiment of the present invention.
Figure 16:
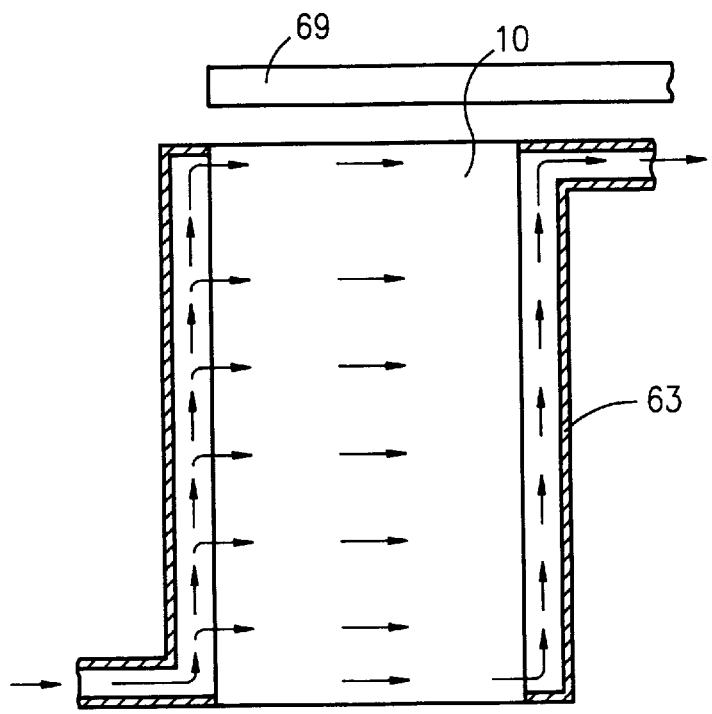
FIG. 16 is a schematic side view showing, in an enlarged form, the neighborhood of the reduction lens shown in FIG. 15.
Figure 17:
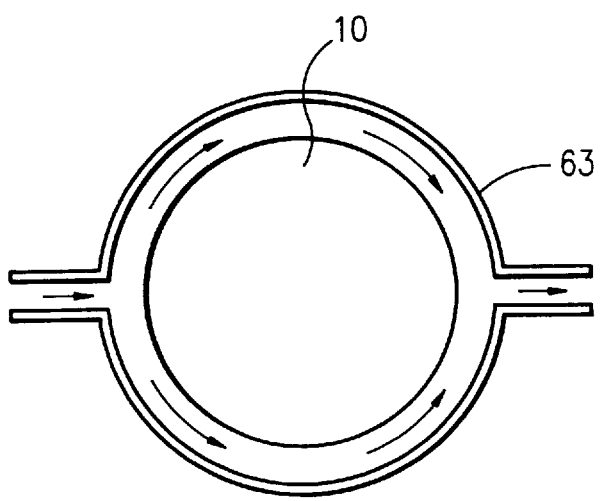
FIG. 17 is a schematic plane view of FIG. 16.

FIG. 15 is a configurational view schematically showing a projection aligner according to a fifth embodiment of the present invention. FIG. 16 is a schematic side view showing, in an enlarged form, the neighborhood of a reticle shown in FIG. 15. FIG. 17 is a schematic plane view of FIG. 16.

In FIGS. 15 through 17, the same elements of structure as those shown in FIGS. 1 through 4 or the elements of structure corresponding to those shown in FIGS. 1 through 4 are identified by the same reference numerals. The projection aligner 60 according to the fifth embodiment is different from the projection aligner 1 according to the first embodiment only in that as an alternative to the first temperature control unit 20, there is provided a third temperature control unit 61 for applying gas temperature-controlled to within ±0.1° C. of a set temperature onto a reduction lens 10 to thereby adjust or control the temperature of the reduction lens 10.

The third temperature control unit 61 has a part 62 for supplying clean air subjected to temperature control and dust removal, a housing 63 for surrounding the scale-down lens 10 and a piping 64 for coupling the supply part 62 and the housing 63 to each other. Similarly to the first temperature control unit 20 shown in FIG. 2, the supply part 62 has a cooler 65, a heater 66, an air blower 67, a ULPA filter 68, a temperature sensor (not shown), a circuit (not shown) for driving the cooler 65 and the heater 66, and a circuit (not shown) for controlling the driving circuit in response to the output of the temperature sensor. Designated at numeral 69 in FIG. 16 is a reticle stage.

Upon projection exposure, as shown in FIGS. 16 and 17, clean air temperature-controlled to within ±0.1° C. of a set temperature by the third temperature control unit 61 is fed into the housing 63 so as to flow along the periphery of the reduction lens 10.

According to the projection aligner 60 of the fifth embodiment, as has been described above, since the reduction lens can be cooled by the clean air temperature-controlled to within ±0.1° C. of the set temperature, the reduction lens does not increase in temperature even if the reduction lens is irradiated with repetitive UV light or deep UV light by the projection aligner, and hence the distribution of distortion of the reduction lens remains unchanged. Therefore, a ULSI subjected to patterning with a high-precision alignment accuracy can be obtained and the yield of production of the ULSI can be greatly improved.

Figure 18:
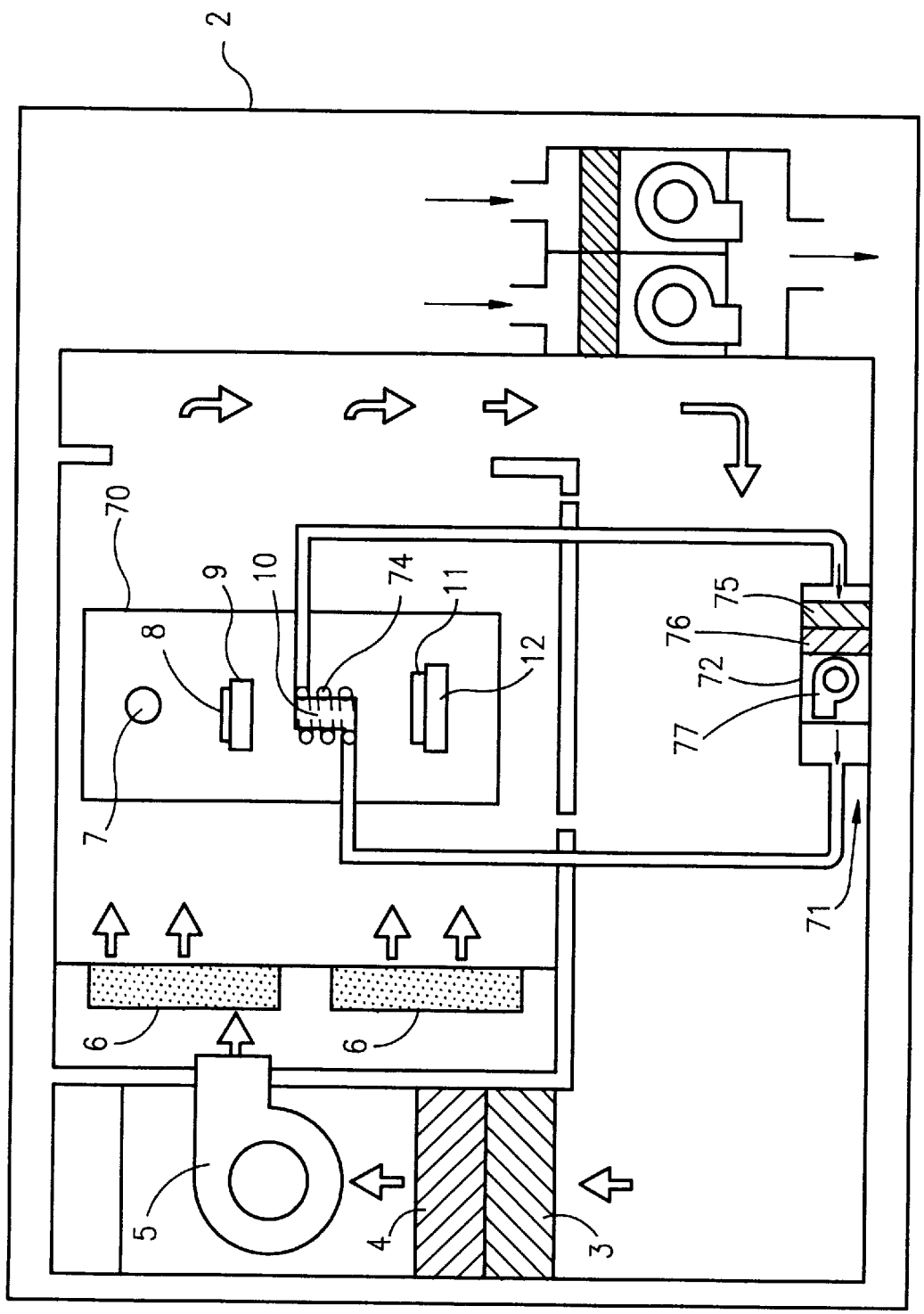
FIG. 18 is a configurational view schematically showing a projection aligner according to a sixth embodiment of the present invention.
Figure 19:
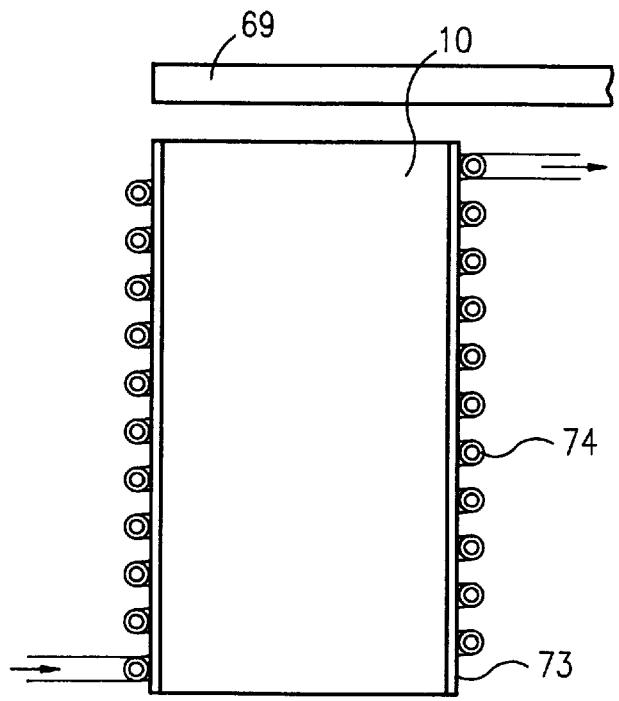
FIG. 19 is a schematic side view showing, in an enlarged form, the neighborhood of a reduction lens shown in FIG. 18.
Figure 20:
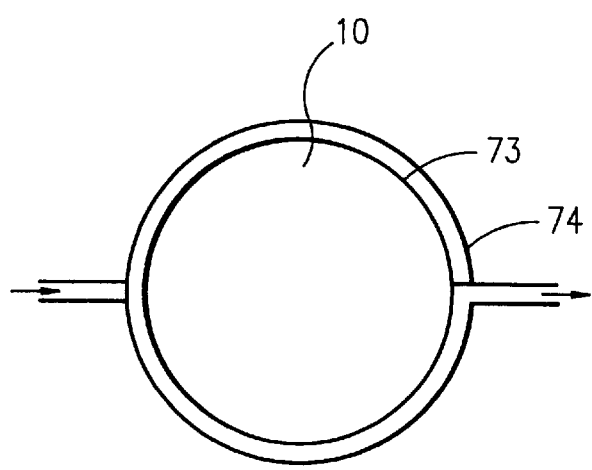
FIG. 20 is a schematic plane view of FIG. 18.

FIG. 18 is a configurational view schematically showing a projection aligner according to a sixth embodiment of the present invention. FIG. 19 is a schematic side view illustrating, in an enlarged form, the neighborhood of a reticle shown in FIG. 18. FIG. 20 is a schematic plane view of FIG. 19.

In FIGS. 18 through 20, the same elements of structure as those shown in FIGS. 1 through 4 or the elements of structure corresponding to those shown in FIGS. 1 through 4 are identified by the same reference numerals. The projection aligner 70 according to the sixth embodiment is different from the projection aligner 1 according to the first embodiment only in that as an alternative to the first temperature control unit 20, there is provided a fourth temperature control unit 71 for allowing cooling water temperature-controlled to within ±0.1° C. of a set temperature to flow around a reduction lens 10 to thereby adjust or control the temperature of the reduction lens 10.

The fourth temperature control unit 71 has a cooling water supply part 72, a cooling plate 73 for surrounding the reduction lens 10 and a piping 74 for spirally surrounding the periphery of the cooling plate 73. In a manner similar to the second temperature control unit 40 shown in FIG. 11, the supply part 72 has a cooler 75, a heater 76, a pump 77, a temperature sensor (not shown), a circuit (not shown) for driving the cooler 75 and the heater 76, and a circuit (not shown) for controlling the driving circuit in response to the output of the temperature sensor.

Upon projection exposure, as shown in FIGS. 19 and 20, the cooling water temperature-controlled to within ±0.1° C. of a set temperature by the fourth temperature control unit 71 is allowed to flow into the piping 74 to thereby control the temperature of the reduction lens 10.

According to the projection aligner 70 of the sixth embodiment, as has been described above, since the reduction lens 10 is cooled by the cooling water temperature-controlled to within ±0.1° C. of the set temperature, the reduction lens does not increase in temperature even if the reduction lens is irradiated with repetitive UV light or deep UV light by the projection aligner, and hence the distribution of distortion of the reduction lens remains unchanged. Therefore, a ULSI subjected to patterning with a high-precision alignment accuracy can be obtained and the yield of production of the ULSI can be greatly improved. Since the cooling using the cooling water is higher than the cooling using the clean air in cooling capacity, the yield of production thereof can be still further improved.

Figure 21:
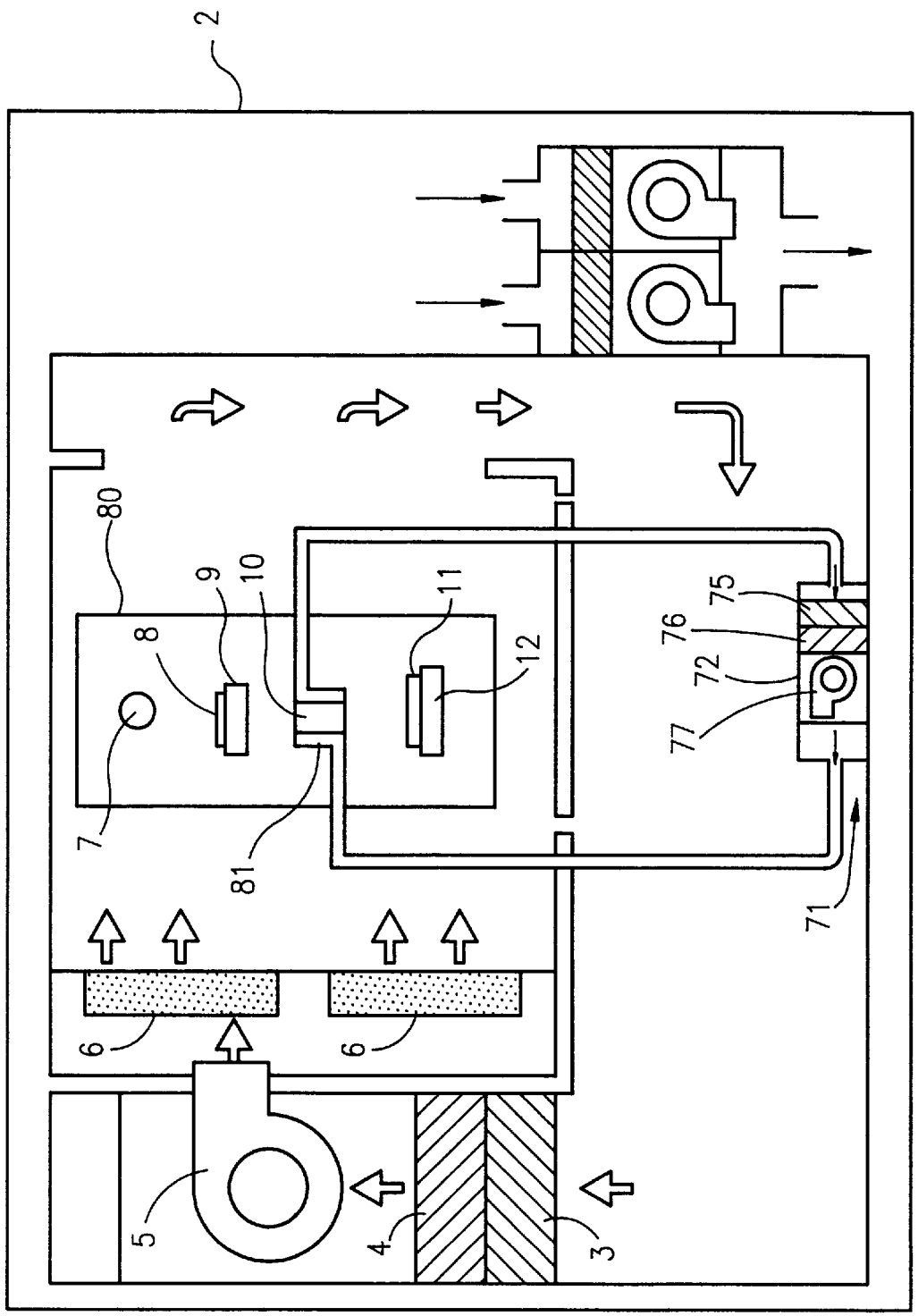
FIG. 21 is a configurational view schematically showing a projection aligner according to a seventh embodiment of the present invention.
Figure 22:
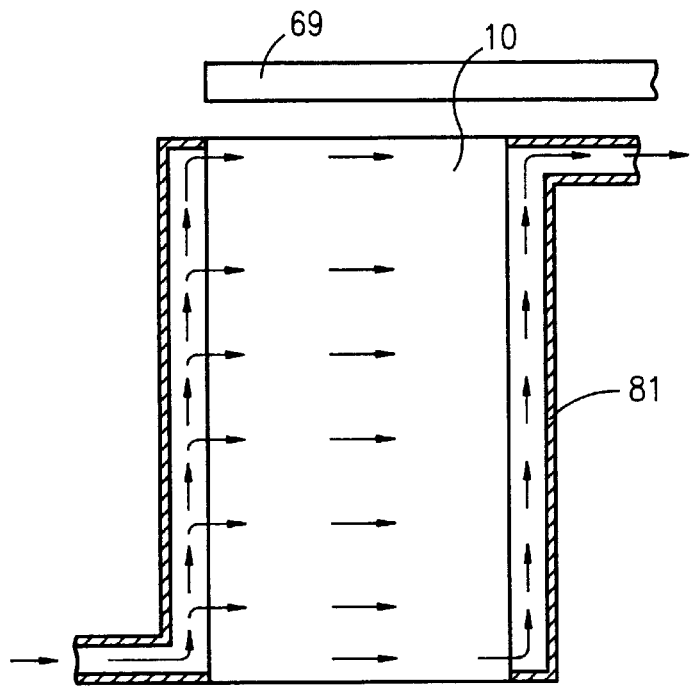
FIG. 22 is a schematic side view showing, in an enlarged form, the neighborhood of a reduction lens shown in FIG. 21.

FIG. 21 is a configurational view schematically showing a projection aligner according to a seventh embodiment of the present invention. FIG. 22 is a schematic side view showing, in an enlarged form, the neighborhood of a reduction lens shown in FIG. 21. FIG. 22 is a schematic plane view of FIG. 21.

Figure 23:
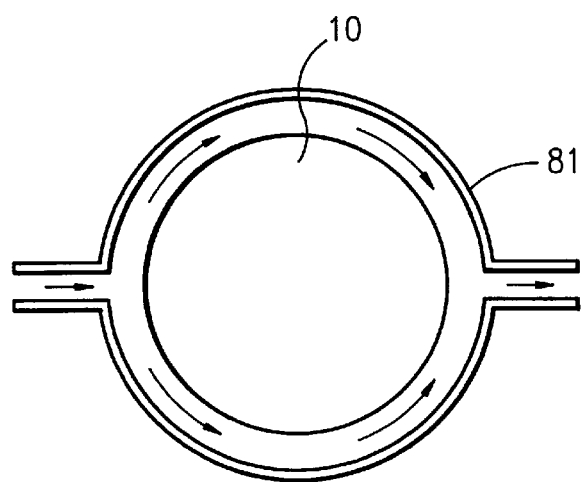
FIG. 23 is a schematic plane view of FIG. 22.

In FIGS. 21 through 23, the same elements of structure as those shown in FIGS. 18 through 20 or the elements of structure associated with those shown in FIGS. 18 through 20 are identified by the same reference numerals. The projection aligner 80 according to the seventh embodiment is different from that according to the sixth embodiment only in that the periphery of a reduction lens 10 in a fourth temperature control unit 71 is surrounded by a housing 81. Upon projection exposure, as shown in FIGS. 22 and 23, cooling water temperature-controlled to within ±0.1° C. of a set temperature by the fourth temperature control unit 71 is introduced into the housing 81 to control the temperature of the reduction lens 10.

According to the projection aligner 80 of the seventh embodiment, as has been described above, since the reduction lens 10 is cooled by the cooling water temperature-controlled to within ±0.1° C. of the set temperature, the reduction lens does not increase in temperature even if the reduction lens is irradiated with repetitive UV light or deep UV light by the projection aligner, and hence the distribution of distortion of the reduction lens remains unchanged. Therefore, a ULSI subjected to patterning with a high-precision alignment accuracy can be obtained and the yield of production of the ULSI can be greatly improved. Since the cooling using the cooling water is higher than the cooling using the clean air in cooling capacity, the yield of production thereof can be still further improved.

FIG. 24 is a configurational view schematically showing a projection aligner according to an eighth embodiment of the present invention.

The projection aligner 90 according to the eighth embodiment is different from the projection aligner 1 according to the first embodiment only in that the projection aligner 90 combines the first temperature control unit 20 shown in FIG. 1 with the third temperature control unit 61 shown in FIG. 15.

Since both a reticle 8 and a reduction lens 10 are temperature-controlled (normally cooled) to within ±0.1° C. of a set temperature in the projection aligner 90 according to the eighth embodiment, a ULSI subjected to patterning with a higher-precision alignment accuracy as compared with where only the reticle is temperature-controlled or where only the reduction lens is temperature-controlled, is obtained. Therefore, the yield of fabrication of the ULSI can be greatly improved.

Further, the combination of the temperature control unit for the reticle 8 and the temperature control unit for the reduction lens 10 is not limited to the above. For example, any of the reticle temperature control units shown in FIGS. 1, 5, 8 and 12 may be combined with any of the lens temperature control units shown in FIGS. 15, 18 and 21.

While the present invention has been described with reference to the illustrative embodiments, this description is not intended to be construed in a limiting sense.

Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An exposure apparatus, comprising:

a reticle stage with a reticle placed thereon;

a light source emitting a light for irradiating said reticle;

a reduction lens positioned so that a pattern drawn on the reticle is projected onto a wafer by light emitted from said light source; and a first temperature control device flowing gas toward a surface of said reticle on said reticle stage from an inclined direction relative to the surface of said reticle for controlling the temperature of said reticle.

2. An exposure apparatus according to claim 1, wherein a temperature of said gas is controlled to within a temperature range of ±0.1° C. of a set temperature, the set temperature being a desired temperature of said reticle.

3. An exposure apparatus according to claim 1, further comprising a cover covering the outer sides of said reticle stage for directing a flow of the gas to at least the sides of the reticle stage.

4. An exposure apparatus according to claim 1, further comprising a second temperature control device having a portion positioned to surround said reticle stage for controlling the temperature of said reticle stage.

5. An exposure apparatus according to claim 4,
wherein said second temperature control device supplies a liquid to the portion of said second temperature control device so that the liquid flows around and surrounds said reticle stage.

6. An exposure apparatus according to claim 5,
wherein a temperature of said liquid is controlled to within a temperature range of ±0.1° C. of the set temperature.

7. An exposure apparatus according to claim 4, further comprising a third temperature control device surrounding said reduction lens.

8. An exposure apparatus according to claim 1, wherein said first temperature control device has a blowing part and an intake part, and the gas flows from the blowing part on one side of said wafer, and the flowing gas is discharged through the intake part at another side of the wafer.

9. An exposure apparatus according to claim 8, wherein said blowing part and said intake part have respective ports positioned between said light source and said reticle stage.

10. An exposure apparatus according to claim 1, wherein said reticle has first and second surfaces, the first surface being opposite to said reticle stage and the second surface having the flowing gas in contact therewith.

11. An exposure apparatus, comprising:
a reticle stage with a reticle placed thereon;
a light source emitting a light for irradiating said reticle;
a reduction lens positioned so that a pattern drawn on the reticle is projected onto a wafer by light emitted from said light source; and
a temperature control device surrounding said reduction lens for controlling the temperature of said reduction lens.

12. An exposure apparatus according to claim 11, wherein said temperature control device flows gas around said reduction lens to surround said reduction lens.

13. An exposure apparatus according to claim 11, wherein the temperature control device supplies liquid around said reduction lens to surround said reduction lens.

14. An exposure apparatus, comprising:
a reticle stage with a reticle placed thereon;
a light source emitting a light for irradiating said reticle;
a reduction lens positioned so that a pattern drawn on the reticle is projected onto a wafer by light emitted from said light source; and
a temperature control device flowing liquid to surround said reticle stage for controlling the temperature of said reticle.

15. A method of exposing a wafer, comprising:
placing a reticle on a reticle stage;
positioning a reduction lens so that a pattern drawn on the reticle is projected onto the wafer; and
controlling a temperature of said reticle by flowing gas toward a surface of the reticle from a direction inclined relative to the surface of the reticle.

16. A method according to claim 15, wherein a temperature of said gas is controlled to within a temperature range of ±0.1° C. of a set temperature, the set temperature being a desired temperature of the reticle.

17. A method according to claim 15, further comprising covering sides of said reticle stage so that the gas flows over outer sides of said reticle stage.

18. A method according to claim 15, wherein said controlling step further controls a temperature of the reduction lens by flowing gas or liquid to surround the reduction lens.

19. A method of exposing a wafer, comprising:
placing a reticle on a reticle stage;
positioning a reduction lens so that a pattern drawn on the reticle is projected onto the wafer; and
controlling a temperature of said reticle stage by flowing a liquid to surround said reticle stage.

20. A method according to claim 19, wherein said controlling step further controls a temperature of said reticle by flowing gas toward a surface of the reticle from a direction inclined relative to the surface of the reticle.

21. A method according to claim 20, wherein a temperature of the gas is controlled to within a temperature range of ±0.1° C. of a set temperature, and a temperature of said liquid is controlled to within a temperature range of ±0.1° C. of the set temperature, the set temperature being a desired temperature of the reticle and the reticle stage.

22. A method according to claim 19, said controlling step further controlling a temperature of said reduction lens by flowing gas or liquid to surround said reduction lens.

23. A method of exposing a wafer, comprising:
placing a reticle on a reticle stage;
positioning a reduction lens so that a pattern drawn on the reticle is projected onto the wafer; and
controlling a temperature of said reduction lens by flowing gas or liquid to surround said reduction lens.

24. A method according to claim 23, wherein a temperature of said gas or liquid is controlled to within a temperature range of ±0.1° C. of a set temperature, the set temperature being a desired temperature of the reduction lens.

* * * * *